US007710803B1

(12) United States Patent
Raghavan

(10) Patent No.: US 7,710,803 B1
(45) Date of Patent: May 4, 2010

(54) HIGH SPEED CIRCUIT AND A METHOD TO TEST MEMORY ADDRESS UNIQUENESS

(75) Inventor: Vijay Kumar Srinivasa Raghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 196 days.

(21) Appl. No.: 12/059,155

(22) Filed: Mar. 31, 2008

Related U.S. Application Data

(60) Provisional application No. 60/909,341, filed on Mar. 30, 2007.

(51) Int. Cl.
*G11C 7/00* (2006.01)

(52) U.S. Cl. .............. 365/201; 365/189.02; 365/189.12; 365/189.08

(58) Field of Classification Search ................. 365/201, 365/189.02, 230.02, 189.08, 189.12, 240
See application file for complete search history.

(56) References Cited

U.S. PATENT DOCUMENTS 5,844,849 A * 12/1998 Furutani ..................... 365/194
6,031,772 A * 2/2000 Nagatomo .................. 365/201

* cited by examiner

*Primary Examiner*—Son Dinh

(57) ABSTRACT

A circuit and method for testing address uniqueness of a memory array are disclosed. The circuit includes a plurality of current sinks associated with rows and columns of the memory array. A plurality of word lines of the memory array are coupled to the plurality of current sinks. A current mirror circuit is coupled to the plurality of current sinks and a circuit output node is coupled to the current mirror circuit. The circuit output node is configured to compare a total current from tested word lines of the memory array with a predetermined reference current, and to output a test pass or test fail indication in response to the comparison.

20 Claims, 4 Drawing Sheets

HIGH SPEED CIRCUIT AND A METHOD TO TEST MEMORY ADDRESS UNIQUENESS

This application claims priority under 35 U.S.C. §119(e) to U.S. Provisional Application No. 60/909,341, filed on Mar. 30, 2007, the entire contents of which are hereby incorporated by reference herein.

BACKGROUND

1. Field of the Invention

The present invention relates to testing memory arrays. More particularly, the present invention relates to a high speed method and circuit for testing non-volatile memory devices for address uniqueness.

2. Background Information

A conventional address uniqueness test in memory devices is a significant test in the memory device manufacturing process. Due to silicon defects in the address path, stuck-at-faults occur in the address path, which can cause address uniqueness to fail. The address uniqueness testing is done to screen bad components in a memory device having address uniqueness failure even before testing for the more time consuming memory program or erase write or read testing.

One such conventional technique of address uniqueness testing involves writing to and reading from the memory. In order to cover all the addresses, all address locations are written and read with unique data bytes. In another conventional technique, the method of uniqueness testing involves a single latch/flip-flop per word line and column line output that stores the state of the word line or column line. The word or column line is then serially sent to logic to identify if one and only one address is enabled. In yet another conventional case, the method involves the use of a ladder-like series configuration of transistors built over the rows and columns of the memory array.

FIG. 1 illustrates a circuit diagram 100 of a four word line ladder structure 115. The ladder structure 115 comprises a plurality of transistors (referenced as 101, 102, 103, 104, 105, 106, 107, 108, 109, 110 and 111) arranged in vertical and horizontal legs fed by an input coupled to a ground terminal (Vgnd). The output of the ladder structure 115 serves as inputs to a read out logic 112 (AND gate) via a parallel leaker resistance circuit that is charged by a power supply (Vpwr). The leaker resistance circuit comprises a first resistor leaker_0 113 and a second resistor leaker_1 114. The first leaker resistor 113 is further coupled to an input of the read out logic 112 via an inverter 116. The leaker resistance circuit is powered by a supply voltage (Vpwr). The gates of the transistors in the ladder structure 115 are controlled by word lines (W0, W1, W2, W3, W0b, W1b, W2b and W3b). The ladder structure 115 is triggered by a signal Vgnd from the top of the ladder structure through the horizontal and vertical legs to overcome a weak power supply signal (Vpwr) triggered through the second resistor leaker_1 114. The signal Vgnd further enables the read out logic 112 to identify one of the three ideal operating conditions of the word lines and to thereby provide an output (Pass/Fail) for the address uniqueness test. The three operating conditions for determining memory address uniqueness are: no word lines active; one word line active; and two or more word lines active.

The conventional methods for address uniqueness tests have limitations in terms of longer testing time and parallel operation of sensing and writing circuitries. Although the testing is done for address uniqueness alone, it may also show problems related to memory storage space and limitations of the ladder structure 115 with reference to speed for higher density memories.

It would be desirable to have an improved method and an analog circuit for address uniqueness test in memory devices, which will significantly decrease test time for high density non-volatile memories.

SUMMARY OF THE INVENTION

A circuit and method for testing address uniqueness of a memory array are disclosed. In accordance with exemplary embodiments of the present invention, according to a first aspect of the present invention, the circuit includes a plurality of current sinks associated with rows and columns of the memory array, wherein a plurality of word lines of the memory array are coupled to the plurality of current sinks. A current mirror circuit is coupled to the plurality of current sinks and a circuit output node is coupled to the current mirror circuit, wherein the circuit output node is configured to compare a total current from tested word lines of the memory array with a predetermined reference current, and to output a test pass or test fail indication in response to the comparison.

According to the first aspect, the circuit output node includes a plurality of current-to-voltage amplifiers coupled to an inverter and a logic gate. The plurality of current sinks includes a plurality of current mirror transistors configured in paired series, and wherein a first transistor of the current mirror transistor includes a gate coupled to a gate of a bias transistor, and a second transistor of the current mirror transistor includes a gate coupled between a row driver and a memory row. Each of the current-to-voltage amplifiers receives a set of input currents from an output of the set of current mirror transistors and a current reference unit. The current reference unit is coupled to a common gate path of at least one of the plurality of current sinks to form an input bias voltage node. An output of each word line is coupled to a gate path of at least one of the plurality of current sinks. A common drain path of at least one of the plurality of current sinks is coupled to a drain path and a gate path of at least one of a set of current mirror transistors of the current mirror circuit. The circuit includes a current reference coupled to a bias transistor, wherein both the current reference and the bias transistor are coupled between a power supply terminal and a ground reference terminal forming a current reference unit. A gate path and a drain path of the bias transistor are coupled to form an input bias voltage node.

According to a second aspect of the present invention, a method to check address uniqueness of a memory device includes a first step of sinking current over rows and columns of a memory array of the memory device. A second step is enabling a first test condition, wherein a plurality of word lines of the memory array is inactive to generate a first output voltage to generate a failed state. A third step is enabling a second test condition, wherein one word line of the plurality of word lines of the memory array is active to generate a second output voltage to generate a passed state. A fourth step is enabling a third test condition, wherein two or more word lines of the plurality of word lines of the memory array are active to generate a third output voltage indicating the failed state, wherein each of the first, second and test conditions includes configuring a current reference for comparison with a row current, and wherein results of the comparison are gated to generate the address uniqueness status of the memory device.

According to the second aspect, the step of enabling a first test condition includes amplifying a first input differential current to generate a first logic high output voltage at a first output node followed by generating a logic low output voltage at an inverted output node. A second input differential current is amplified to generate a second logic high output voltage at a second output node, and wherein the logic low output voltage and the second logic high output voltage are gated to generate the failed state. The step of enabling a second test condition includes amplifying a first input differential current to generate a logic low output voltage at a first output node followed by generating a first logic high output voltage at an inverted output node. A second input differential current is amplified to generate a second logic high output voltage at a second output node, and wherein the first logic high output voltage and the second logic high output voltage are gated to generate the passed state. The step of enabling a third test condition includes amplifying a first input differential current to generate a first logic low output voltage at a first output node followed by generating a logic high output voltage at an inverted output node. A second input differential current is amplified to generate a second logic low output voltage at a second output node, and wherein the logic high output voltage and second logic low output voltage are gated to generate the failed state.

According to a third aspect of the present invention, a method of testing address uniqueness of a memory device includes a first step of checking a plurality of test conditions using a current-to-voltage amplifier. The method includes a second step of checking for a first condition of no active word lines by the current-to-voltage amplifier to generate an address uniqueness failure indication. The method includes a third step of checking for a second condition of at least two active word lines by the current-to-voltage amplifier to generate the address uniqueness failure indication.

According to the third aspect, the method includes a step wherein both the first condition and the second condition are alternately checked in a time multiplexed scheme.

According to a fourth aspect of the present invention, a testing device is disclosed, which includes an amplifier circuit, wherein an input node of the amplifier circuit is coupled to an array of current sources and to a current mirror circuit. A time division multiplexing control circuit is coupled to a current reference input terminal of the amplifier circuit, wherein the time division multiplexing circuit is configured to cause generation of a first current reference at a first time stamp and generation of a second current reference at a second time stamp. At least one register circuit is coupled at an enable input to an output node of the time division multiplexing control circuit and is coupled to an output node of the amplifier circuit, wherein at least one register circuit is configured to store an output of the amplifier circuit in accordance with an enable signal generated by the time division multiplexing control circuit; and a logic gate coupled to an output node of the at least one register circuit, wherein the logic gate is configured to generate a test output.

According to the fourth aspect, the amplifier circuit includes a current-to-voltage converter circuit. The current-to-voltage converter circuit further includes a current reference generator.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Figure 1:
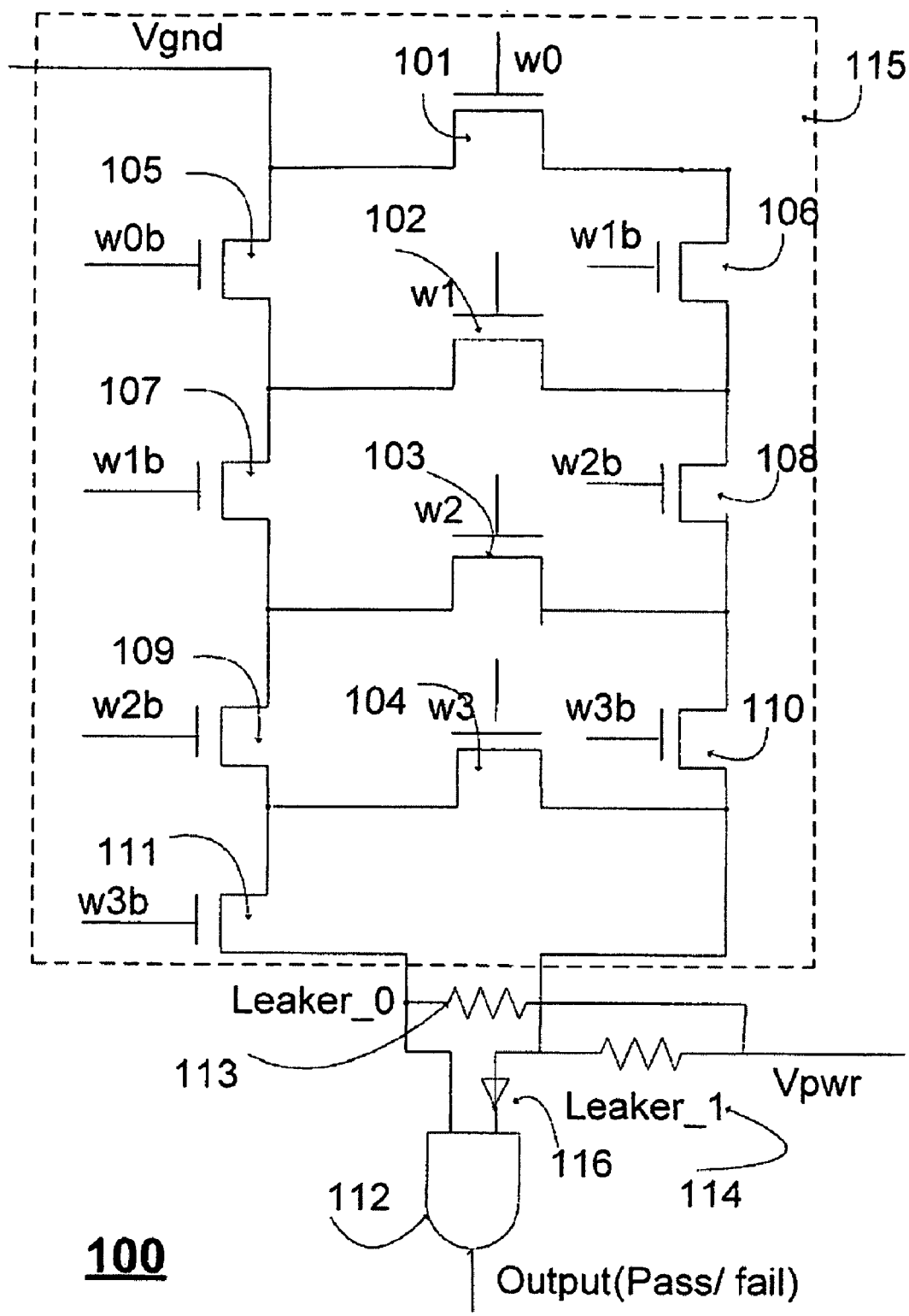
FIG. 1 illustrates a circuit diagram of a conventional ladder structure for determining address uniqueness in a memory device.

Exemplary embodiments of the present invention are directed to an improved analog circuit and a method for testing a memory device for address uniqueness. The circuit and method of the present invention can screen bad memory parts in a memory manufacturing process. The invention presents a method for address uniqueness testing, which significantly decreases test time especially in the case of non-volatile memories. However, the present invention is not confined to non-volatile memory devices. In an embodiment of the invention, the improved circuit comprises a plurality of current sinks associated with rows and columns of the memory array, wherein a plurality of word lines of the memory array are coupled to the plurality of current sinks; a current mirror circuit coupled to the plurality of current sinks; and a circuit output node coupled to the current mirror circuit, wherein the circuit output node is configured to compare a total current from tested word lines of the memory array with a predetermined reference current, and to output a test pass or test fail indication in response to the comparison.

An additional exemplary embodiment of the invention is directed to a method for checking address uniqueness of a memory device, comprising a first step of sinking current over rows and columns of a memory array of the memory device. The method comprises a second step including enabling a first test condition, wherein a plurality of word lines of the memory array is inactive to generate a first output voltage to generate a failed state. The method comprises a third step including enabling a second test condition, wherein one word line of the plurality of word lines of the memory array is active to generate a second output voltage to generate a passed state. The method comprises a fourth step including enabling a third test condition, wherein two or more word lines of the plurality of word lines of the memory array are active to generate a third output voltage indicating a failed state, wherein each of the first, second and test conditions includes configuring a current reference to be compared with a row current, and wherein results of the comparison are gated to generate the address uniqueness status of the memory device.

A further exemplary embodiment of the invention is directed to a testing device, comprising an amplifier circuit, wherein an input node of the amplifier circuit is coupled to an array of current sinks and to a current mirror circuit. A time division multiplexing control circuit is coupled to a current reference input terminal of the amplifier circuit, wherein the time division multiplexing circuit causes generation of a first current reference at a first time stamp and generation of a second current reference at a second time stamp. At least one register circuit is coupled at an enable input to an output node of the time division multiplexing control circuit and coupled to an output node of the amplifier circuit, wherein the register circuit is configured to store an output of amplifier in accordance with an enable signal generated by the time division multiplexing control circuit; and a logic gate is coupled to an output node of the register circuit, wherein the logic gate is configured to generate a test output.

Figure 2:
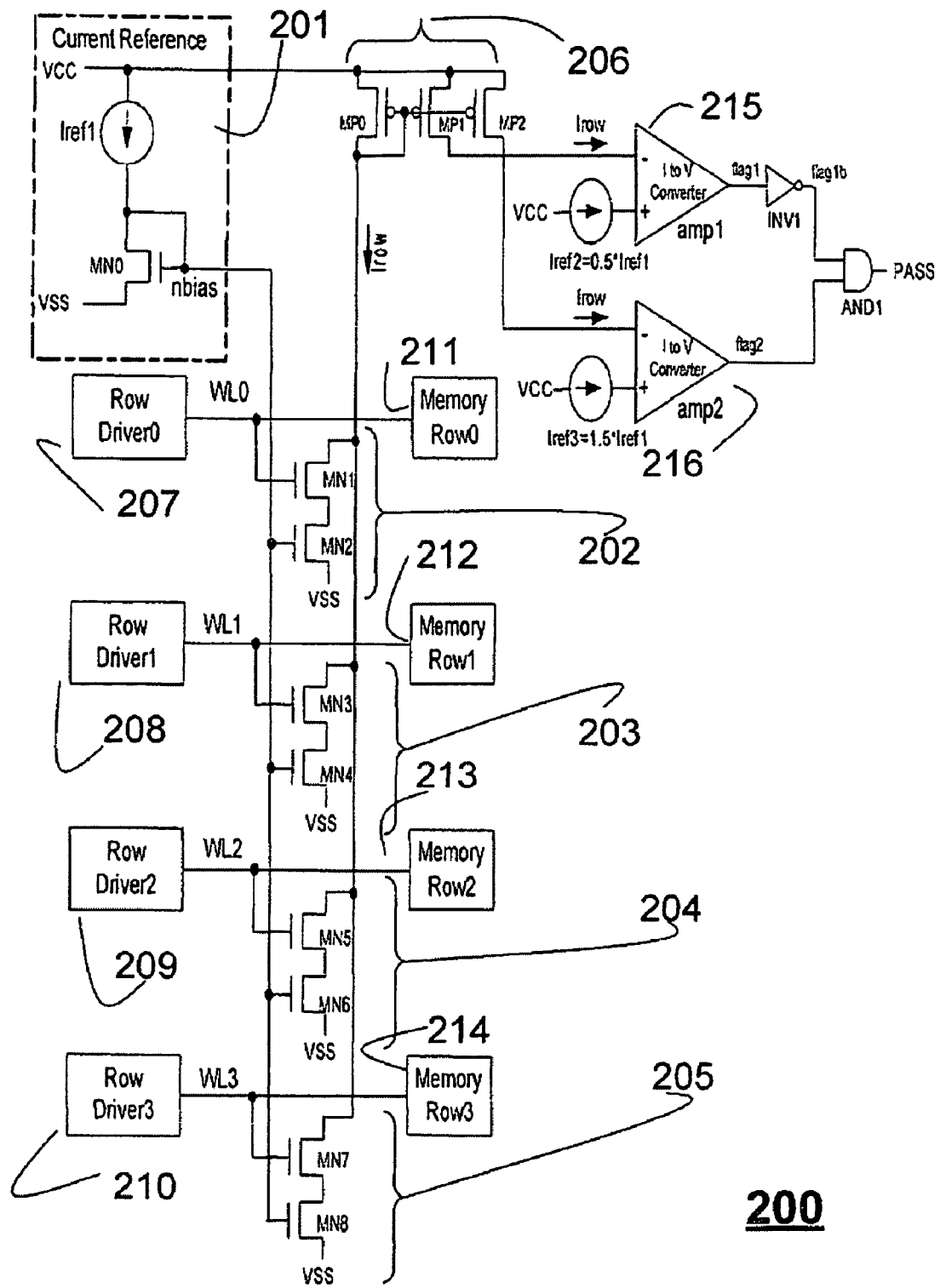
FIG. 2 illustrates a circuit diagram of an analog circuit for determining address uniqueness in a memory device according to an embodiment of the present invention.

These and other aspects of the present invention will now be described in greater detail with reference to detailed description of the preferred embodiments of the invention. FIG. 2 illustrates an improved circuit 200 for checking address uniqueness of a memory device. In the following discussion, an exemplary embodiment of a four word line structure is illustrated. Those of ordinary skill in the art will recognize that exemplary embodiments of the present invention can be used with any suitable word line structure having any appropriate number of word lines. Thus, for purposes of illustration and not limitation, the circuit 200 comprises a four word line structure, designated as a first word line (WL0), a second word line (WL1), a third word line (WL2) and a fourth word line (WL3). In the present illustration, each of the four word lines comprises of a row driver (designated respectively as 207, 208, 209 and 210) and a corresponding memory row (designated respectively as 211, 212, 213 and 214). The circuit 200 includes a current reference source 201 further comprising a bias transistor (MN0) coupled between a voltage terminal (Vcc) and a common ground (Vss) and a current source Iref1. The word lines are configured to control any suitable number of current mirror transistor pairs arranged in rows (e.g., in the present illustration, four). For clarity, these transistor pairs can be designated, in an example, as a first set of current mirror pairs, and can be grouped as a first pair MN1 and MN2 designated as 202, a second pair MN3 and MN4 designated as 203, a third pair MN5 and MN6 designated as 204, and a fourth pair MN7 and MN8 designated as 205. The first set of current mirrors is coupled between the current reference source 201 and the circuit output (PASS) via a second set of current mirror pairs 206. Transistors MN2, MN4, MN6 and MN8 are current mirrors whose common gates are coupled to the gate of the bias transistor MN0 to form an input bias voltage node (nbias). The input bias voltage node nbias is also coupled to the drain of bias transistor MN0. The gates of transistors MN1, MN3, MN5 and MN7 are coupled to the respective word line output of the row drivers (207, 208, 209 and 210). Transistor MN1 is serially coupled to MN2. Likewise, MN3 is serially coupled to MN4, MN5 is serially coupled to MN6, and MN7 is serially coupled to MN8.

The drains of transistors MN1, MN3, MN5 and MN7 are commonly coupled to the drain and gate of one of the transistors MP0 of the second set of current mirror pairs. The second set of current mirrors comprises transistors MP0, MP1 and MP2, together designated as 206. The outputs of the transistors MP1 and MP2 each serve as one of the inputs to two current-to-voltage amplifiers, respectively. The amplifiers can be designated as a first current-to-voltage amplifier (amp1) 215 and a second current-to-voltage amplifier (amp2) 216. The first (e.g., negative) inputs of both of the amplifiers are fed with current (Irow) sourced from the transistors MP1 and MP2 of the second set of current mirror pairs 206. The second (e.g., positive) input of the first current-to-voltage amplifier 215 is a reference current (Iref2) and the second (e.g., positive) input of the second current-to-voltage amplifier 216 is reference current (Iref3). The reference currents Iref2 and Iref3 are sourced from the current reference source 201. For example, according to an exemplary embodiment, Iref2 can equal 0.5*Iref1 and Iref3 can equal 1.5*Iref1, although any other suitable reference currents can be used. The output (flag 1) of the first current-to-voltage amplifier 215 is inverted via an inverter (INV1) to further generate an inverted output (flag1$b$). The inverted output (flag1$b$) and the output (flag2) of the second current-to-voltage amplifier 216 are fed as inputs to a logic gate (AND1 gate, for example) to give a final pass/fail output indication (PASS).

For purposes of clarity, FIG. 2 illustrates the word lines to explain the exemplary embodiments of the present invention. Exemplary embodiments can also be used with column output lines of the memory device. The address uniqueness testing is further illustrated in the form of identifying three possible operating conditions, although greater or fewer operating conditions can be used according to the present invention. For example, the first operating condition occurs when no word lines are active (a failing condition, for example), the second operating condition occurs when only one word line is active (a passing condition, for example), and the third operating condition occurs when two or more word lines are active (a failing condition, for example). The circuit 200 can operate in all three conditions with high speed to determine address uniqueness of memory devices that are of large densities and other suitable memory devices.

For example, to illustrate the exemplary three operating conditions, a numerical example is cited (for example, assuming Iref1=10 μA, Iref2=5 μA and Iref3=15 μA, although other suitable current values can be used with embodiments of the present invention). In the first operating condition, wherein no word lines are active: WL0, WL1, WL2 and WL3 are zero, forcing the amplifier input current Irow to be zero. The first current-to-voltage amplifier (amp1) 215 amplifies the input differential current (for example, Iref2−Irow=5 μA−0 μA=5 μA), and provides a high voltage output (flag 1), which further provides an inverted low output voltage at the output node (flag 1$b$). Similarly, the second current-to-voltage amplifier (amp2) 216 amplifies the input differential current (for example, Iref3−Irow=15 μA−0 μA=15 μA) and provides a high output voltage (flag 2). Hence, the final output of the logic gate (AND1) indicates a logic low, signifying a failing condition.

In the second operating condition, wherein only one word line is active: WL0 is high, WL1=WL2=WL3 is low, then current Irow=10 μA. The first current-to-voltage amplifier (amp1) 215 amplifies the input differential current (for example, Iref2−Irow=5 μA−10 μA=−5 μA) and provides a low output voltage (flag1) which further provides an inverted high output voltage at the output node (flag1$b$). Similarly, the second current-to-voltage amplifier (amp2) 216 amplifies the input current differential (for example, Iref3−Irow=15 μA−10 μA=5 μA) and provides a high output voltage (flag2). Hence, the final output of the logic gate (AND1) indicates logic high, signifying a passing condition.

In the third operating condition, wherein two or more word lines are active: WL0=WL1=high and WL2=WL3=low, then the current Irow=20 μA. The first current-to-voltage amplifier (amp1) 215 amplifies the input differential current (for example, Iref−Irow=5 μA−20 μA=−15 μA) and provides a low output (flag 1) which further provides an inverted high output voltage at the output node (flag1$b$). Similarly, the second current-to-voltage amplifier (amp2) 216 amplifies the input differential current (for example, Iref3−Irow=15 μA−20 μA=−5 μA) and provides a low output (flag2) voltage. Hence, the final output of the logic gate (AND1) indicates a low, signifying a failing condition.

Figure 3:
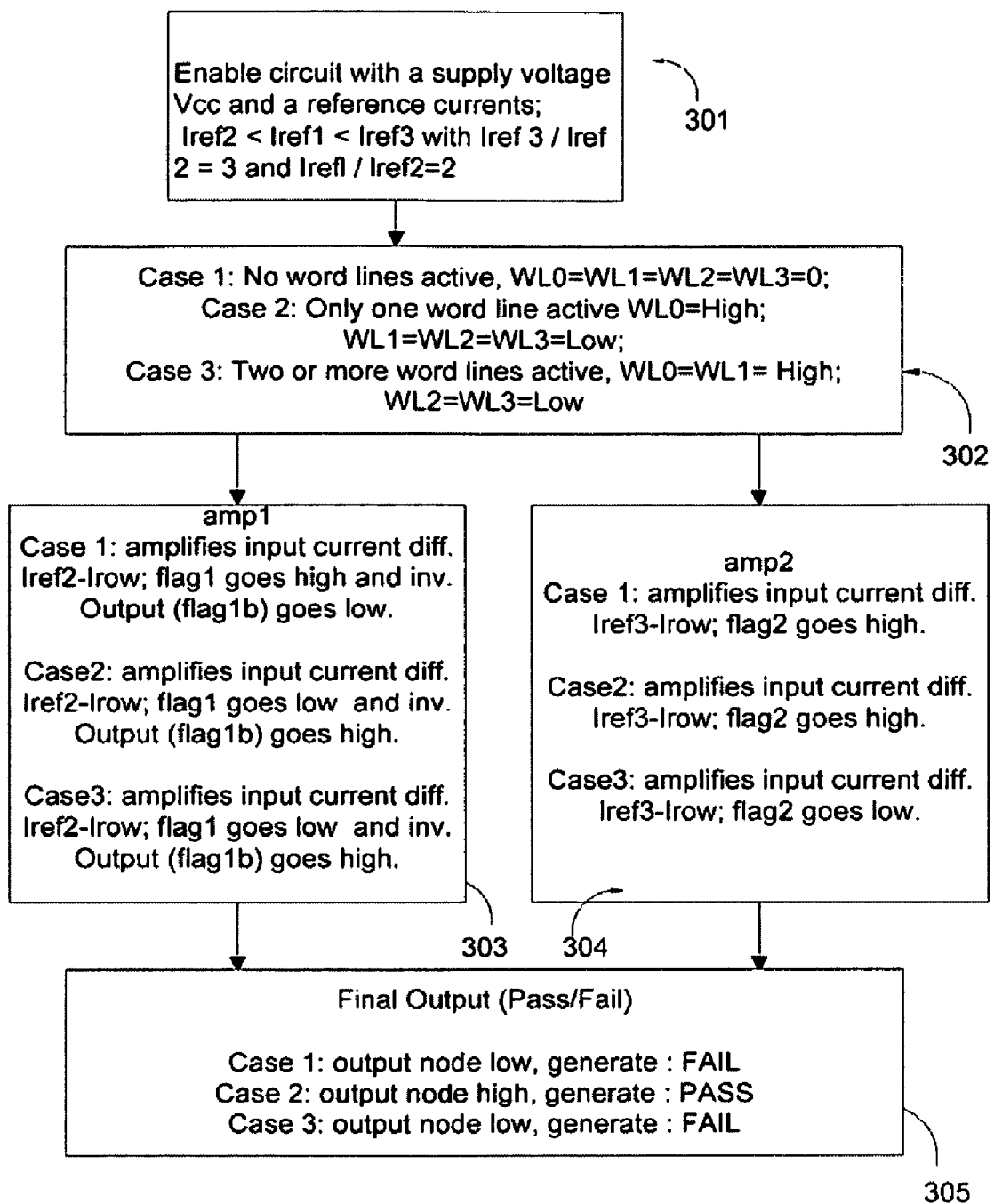
FIG. 3 illustrates a flow chart of a method to check the address uniqueness of a memory device according to an embodiment of the present invention.

For purposes of illustration and not limitation, FIG. 3 illustrates a flow chart 300, which depicts a method for address uniqueness testing in a memory circuit in accordance with an exemplary embodiment of the invention. Merely for purposes of clarity, the steps in the flow chart 300 are described in conjunction with the circuit 200 of FIG. 2, although exemplary embodiments of the present invention can be used with other suitable circuit configurations. According to an example of the invention, a first step 301 comprises enabling the circuit with a supply voltage (Vcc) relative to ground terminal (Vss) and maintaining reference currents in, for example, a Iref2<Iref1<Iref3 order of magnitude with the ratios of, for example, Iref3/Iref2=3 and Iref1/Iref2=2. According to another example of the invention, a second step 302 comprises checking three activating conditions of the word lines of the memory circuit: the first case (Case 1) where no word lines are active; the second case (Case 2) where only one word line is active; and the third case (Case 3) where two or more word lines are active.

According to an example of the invention, a third step 303 of the flow chart 300 comprises the operation of a first amplifier (e.g., amp1, as referred to in FIG. 2) in amplifying an input differential current (e.g., Iref2−Irow) in all the three respective conditions corresponding to Case 1, Case 2 and Case 3 of the second step 302. In the third step 303, a first case (Case 1) comprises amplifying input differential current (e.g., Iref2−Irow) to generate a high output (e.g., flag1, as referred to in FIG. 2) and then to generate an inverted low output (e.g., flag1b, as referred to in FIG. 2). In the third step 303, a second case (Case 2) comprises amplifying input differential current (e.g., Iref2−Irow) to generate a low output (e.g., flag1, as referred to in FIG. 2) and then to generate an inverted high output (e.g., flag1b, as referred to in FIG. 2). In the third step 303, a third case (Case 3) comprises amplifying input differential current (e.g., Iref2−Irow) to generate a low output (e.g., flag1, as referred to in FIG. 2) and then to generate an inverted high output (e.g., flag1b, as referred to in FIG. 2).

According to another example of the invention, a fourth step 304 comprises operation of a second amplifier (e.g., amp2, as referred to in FIG. 2) in amplifying a input differential current (e.g., Iref3−Irow) in all the three respective conditions corresponding to Case 1, Case 2 and Case 3 of the second step 302. In the fourth step 304, a first case (Case 1) comprises amplifying the input differential current (e.g., Iref3−Irow) to generate a high output (e.g., flag2, as referred to in FIG. 2). In the fourth step 304, a second case (Case 2) comprises amplifying the input differential current (e.g., Iref3−Irow) to generate a high output (e.g., flag2, as referred to in FIG. 2). In the fourth step 304, a third case (Case 3) comprises amplifying the input differential current (e.g., Iref3−Irow) to generate a high output (e.g., flag2, as referred to in FIG. 2).

According to another example of the invention, the steps 303 and 304 of the flow chart 300 are terminated by a step 305, which generates a final output indication (Pass or Fail) corresponding to Case 1, Case 2 and Case 3 of the steps 303 and 304, respectively. According to a Case 1, a FAIL output is generated if the output node is low. According to a Case 2, a PASS output is generated if the output node is high. According to a Case 3, a FAIL output is generated if the output node is low.

Simulation tests in accordance with an exemplary embodiment of the present invention have shown that a delay of, for example, around 25 nanoseconds (ns) was achieved while testing, for example, 512 word lines with a reference current (Iref1) of 10 µA. According to another example of the invention, the total time for testing all the rows of a 256 KB macro with a 512 bytes page and 512 rows is around 12.8 µs, which is significantly less than the time taken to run simulation tests with the conventional circuits. The testing time can be further reduced by increasing reference currents Iref1, Iref2 and Iref3. Also, the present analog address uniqueness scheme can be configured to support a large number of word lines, and, hence, the memory architecture (such as that depicted in FIG. 2) can be suitably changed or otherwise modified to support higher numbers of rows. It is noted that the delay values and current values given in the present description are merely exemplary values for illustration purposes only, and are not intended to limit the scope of this invention.

Figure 4:
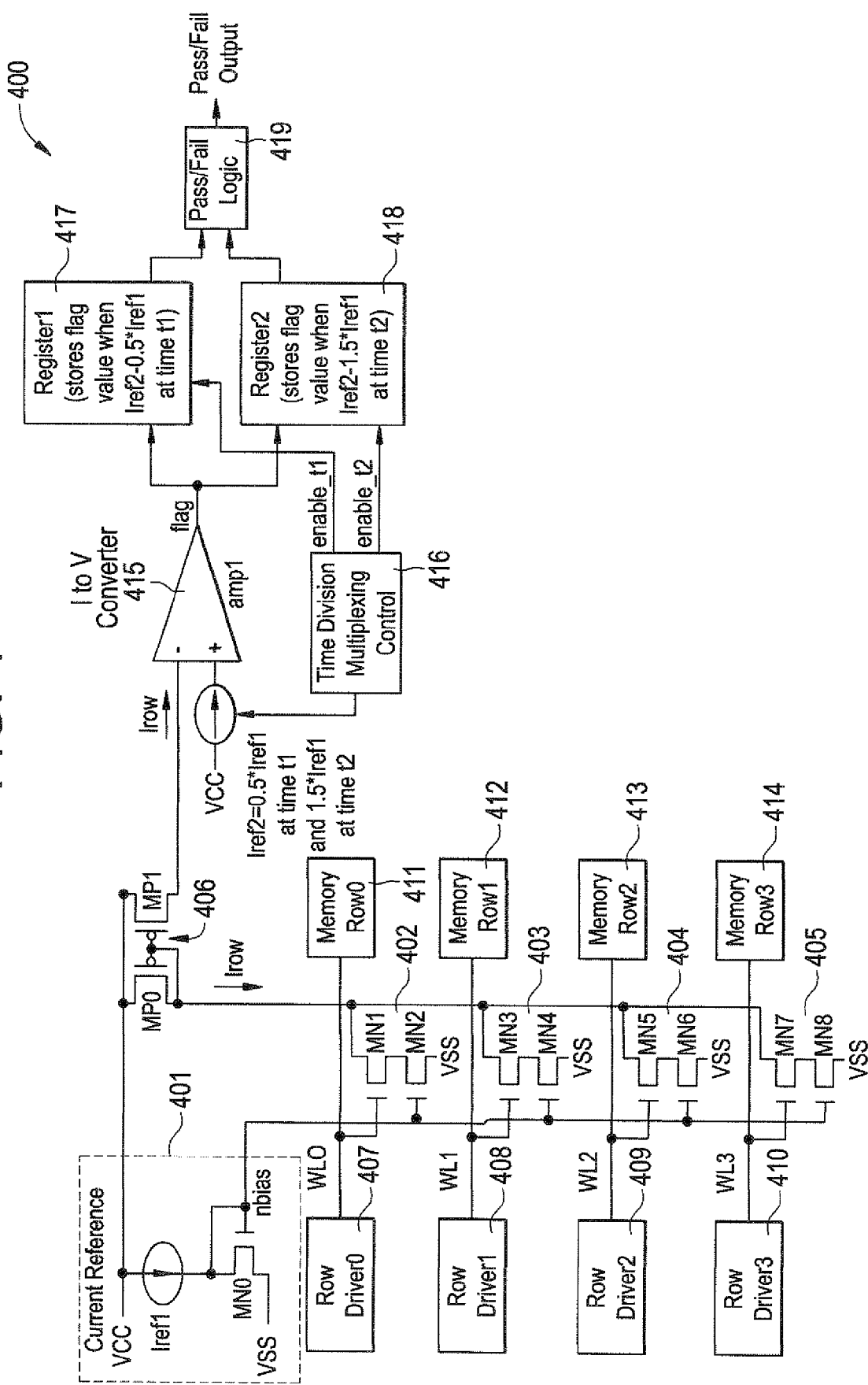
FIG. 4 illustrates a system for determining address uniqueness in a memory device, the system including a time multiplexing subsystem according to an embodiment of the present invention.

In an alternate embodiment, the present invention can be configured in a time multiplexed scheme, instead of simultaneously using two current-to-voltage amplifiers. FIG. 4 illustrates a system for determining address uniqueness in a memory device, the system including a time multiplexing subsystem according to an embodiment of the invention. For purposes of illustration and not limitation, the circuit 400 comprises a four word line structure (although other suitable numbers of word lines can be used), designated as a first word line (WL0), a second word line (WL1), a third word line (WL2) and a fourth word line (WL3). Each of the four word lines comprises of a row driver (designated respectively as 407, 408, 409 and 410) and a corresponding memory row (designated respectively as 411, 412, 413 and 414). The circuit 400 includes a current reference source 401 further comprising a bias transistor (MN0) coupled between a voltage terminal (Vcc) and a common ground (Vss) and a current source Iref1. The configuration of the current reference source 401 is similar to that of current reference source 201 illustrated in FIG. 2. The word lines can control any suitable number of current mirror transistor pairs (e.g., in the present illustration, four) arranged in rows. For clarity, these current mirror pairs can be designated, in an example, as first set of current mirrors and can be grouped as a first pair MN1 and MN2 designated as 402, a second pair MN3 and MN4 designated as 403, a third pair MN5 and MN6 designated as 404, and a fourth pair MN7 and MN8 designated as 405.

Thus, the first set of current mirrors is coupled between the current reference source 401 and the circuit output (PASS/FAIL output) via a second set of current mirror pairs 406. Transistors MN2, MN4, MN6 and MN8 are current mirrors whose common gates are coupled to the gate of the bias transistor MN0 to form an input bias voltage node (nbias). The input bias voltage node nbias is also coupled to the drain of bias transistor MN0. The gates of transistors MN1, MN3, MN5 and MN7 are coupled to the respective word line output of the row drivers (407, 408, 409 and 410). Transistor MN1 is serially coupled to MN2. Likewise, MN3 is serially coupled to MN4; MN5 is serially coupled to MN6; and MN7 is serially coupled to MN8.

The drains of transistors MN1, MN3, MN5 and MN7 are commonly coupled to the drain and gate of the transistor MP0 of the second set of current mirror pairs. The second set of current mirror pairs further comprises MP0 and MP1, together designated as 406. The output terminal of the transistor MP1 is an input (e.g., negative input) to a current-to-voltage amplifier 415, wherein a current Irow is fed to the current-to-voltage amplifier 415. A current reference Iref2 is coupled to a second input terminal (positive input terminal, for example) of the current-to-voltage amplifier 415, and the current reference circuit Iref2 is enabled by a time division multiplexing control circuit 416. In particular, a different reference current (indicated as, for example, Iref2) is fed to the positive input terminal of the current-to-voltage amplifier 415 at different times. In accordance with an example of the invention, a first reference current equal to approximately 0.5*Iref1 (where Iref1 is the current reference generator of the current reference source 401) is fed to the positive input terminal of the current-to-voltage amplifier 415 corresponding to a time stamp t1 generated by the time division multiplexing control circuit 416. In accordance with another example of the invention, a second reference current equal to approximately 1.5*Iref1 is fed to the positive input terminal of the current-to-voltage amplifier 415 corresponding to a time stamp t2 (different from time stamp t1) generated by the time division multiplexing control circuit 416. The time division multiplexing control circuit 416 generates either an enable_t1 output or an enable_t2 output corresponding to time stamps t1 and t2, respectively. The signal enable_t1 is coupled to an enable node of a register 417, and the signal enable_t2 is connected to an enable node of a register 418. Both the registers 417 and 418 are coupled at their respective input nodes to the output from the current-to-voltage amplifier 415 (signal flag, for example). Each register 417 and 418 has an output connected to a PASS/FAIL logic 419. The register 417 is configured to store a suitable flag value when the Iref2 is equal to, for example, 0.5*Iref1 at time stamp t1, and the register 418 is configured to store a suitable flag value when the Iref2 is equal to, for example, 1.5*Iref1 at time stamp t2.

According to an example of the invention, the PASS/FAIL logic circuit 419 includes an AND logic gate to generate an address uniqueness test output of the memory device. Thus, the PASS/FAIL logic circuit 419 is configured to appropriately combine the flag value from register 417 and the flag value from register 418 to generate the test pass or test fail output indication, wherein the combination of flag value from register 417 and from register 418 is logically ANDED (by means of a AND gate) in the PASS/FAIL logic circuit 419. Such a time multiplexed method of testing address uniqueness of the memory device has the advantage of using only one current-to-voltage amplifier to check the multiple test cases of the memory array in a sequential manner.

Advantages of an improved analog circuit and method of testing memory address uniqueness according to exemplary embodiments of the present invention include, for example, significant speed enhancement, no access to the memory array thereby avoiding possible test errors, larger memory architectures having large number of rows, enhanced memory testing in shorter time periods, and also saving on silicon area. Further, the improved circuit tests only the address path, and no access to the memory array is required.

Exemplary embodiments of the present invention can be used in conjunction with any suitable type of integrated circuit, memory, storage device or the like. A design for test (DFT) technique in accordance with exemplary embodiments of the present invention can comprise a technique for address uniqueness testing for large density non-volatile or other suitable memories wherein only the address path is tested and no access to memory array is required. However, embodiments of the present invention are not restricted to non-volatile memory circuits.

Embodiments of the present invention are well suited to performing various other steps or variations of the steps recited herein, and in a sequence other than that depicted and/or described herein. In one embodiment, such a process can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Each of elements of the circuits 200 and 400 can be comprised of any suitable type of electrical or electronic circuit, component or device that is capable of performing the functions associated with the respective element. For example, each of the transistors illustrated in FIGS. 2 and 4 can be any suitable type of transistor or other like device. Any or all of the elements of circuits 200 and 400 can be connected to one another using any suitable type of electrical connection capable of communicating electrical information. Alternatively or additionally, any or all the elements of the circuits 200 and 400 can be formed on, for example, a monolithic substrate. Details of the circuit for checking address uniqueness in a non-volatile memory device in a high speed manner, and the method of achieving same that are widely known and not relevant to the present discussion have been omitted from the present description for purposes of clarity and brevity.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics can be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A circuit for testing address uniqueness of a memory array, comprising:
    a plurality of current sinks associated with rows and columns of the memory array,
        wherein a plurality of word lines of the memory array are coupled to the plurality of current sinks;
    a current mirror circuit coupled to the plurality of current sinks; and
    a circuit output node coupled to the current mirror circuit, wherein the circuit output node is configured to compare a total current from tested word lines of the memory array with a predetermined reference current, and to output a test pass or test fail indication in response to the comparison.

2. The circuit of claim 1, wherein the circuit output node comprises:
a plurality of current-to-voltage amplifiers coupled to an inverter and a logic gate.

3. The circuit of claim 2, wherein the plurality of current sinks comprises:
a plurality of current mirror transistors configured in paired series, and wherein a first transistor of the current mirror transistor comprises a gate coupled to a gate of a bias transistor, and a second transistor of the current mirror transistor comprises a gate coupled between a row driver and a memory row.

4. The circuit of claim 3, wherein each of the current-to-voltage amplifiers receives a set of input currents from an output of the set of current mirror transistors and a current reference unit.

5. The circuit of claim 4, wherein the current reference unit is coupled to a common gate path of at least one of the plurality of current sinks to form an input bias voltage node.

6. The circuit of claim 1, wherein an output of each word line is coupled to a gate path of at least one of the plurality of current sinks.

7. The circuit of claim 1, wherein a common drain path of at least one of the plurality of current sinks is coupled to a drain path and a gate path of at least one of a set of current mirror transistors of the current mirror circuit.

8. The circuit of claim 1, comprising:
a current reference coupled to a bias transistor,
wherein both the current reference and the bias transistor are coupled between a power supply terminal and a ground reference terminal forming a current reference unit.

9. The circuit of claim 8, wherein a gate path and a drain path of the bias transistor are coupled to form an input bias voltage node.

10. A method to check address uniqueness of a memory device, comprising:
sinking current over rows and columns of a memory array of the memory device;
enabling a first test condition, wherein a plurality of word lines of the memory array is inactive to generate a first output voltage to generate a failed state;
enabling a second test condition, wherein one word line of the plurality of word lines of the memory array is active to generate a second output voltage to generate a passed state; and
enabling a third test condition, wherein two or more word lines of the plurality of word lines of the memory array are active to generate a third output voltage indicating the failed state, wherein each of the first, second and test conditions includes configuring a current reference for comparison with a row current, and wherein results of the comparison are gated to generate the address uniqueness status of the memory device.

11. The method of claim 10, wherein the step of enabling a first test condition to generate a first output voltage comprises amplifying a first input differential current to generate a first logic high output voltage at a first output node followed by generating a logic low output voltage at an inverted output node.

12. The method of claim 11, wherein a second input differential current is amplified to generate a second logic high output voltage at a second output node, and wherein the logic low output voltage and the second logic high output voltage are gated to generate the failed state.

13. The method of claim 10, wherein the step of enabling a second test condition to generate a second output voltage comprises amplifying a first input differential current to generate a logic low output voltage at a first output node followed by generating a first logic high output voltage at an inverted output node.

14. The method of claim 13, wherein a second input differential current is amplified to generate a second logic high output voltage at a second output node, and wherein the first logic high output voltage and the second logic high output voltage are gated to generate the passed state.

15. The method of claim 10, wherein the step of enabling a third test condition to generate a third output voltage comprises amplifying a first input differential current to generate a first logic low output voltage at a first output node followed by generating a logic high output voltage at an inverted output node.

16. The method of claim 15, wherein a second input differential current is amplified to generate a second logic low output voltage at a second output node, and wherein the logic high output voltage and second logic low output voltage are gated to generate the failed state.

17. A method of testing address uniqueness of a memory device, comprising the steps of:
checking a plurality of test conditions using a current-to-voltage amplifier;
checking for a first condition of no active word lines by a current-to-voltage amplifier to generate an address uniqueness failure indication; and
checking for a second condition of at least two active word lines by the current-to-voltage amplifier to generate the address uniqueness failure indication.

18. The method of claim 17, wherein both the first condition and the second condition are alternately checked in a time multiplexed scheme.

19. A testing device, comprising:
an amplifier circuit, wherein an input node of the amplifier circuit is coupled to an array of current sources and to a current mirror circuit;
a time division multiplexing control circuit coupled to a current reference input terminal of the amplifier circuit, wherein the time division multiplexing circuit is configured to cause generation of a first current reference at a first time stamp and generation of a second current reference at a second time stamp;
at least one register circuit coupled at an enable input to an output node of the time division multiplexing control circuit and coupled to an output node of the amplifier circuit, wherein the at least one register circuit is configured to store an output of the amplifier circuit in accordance with an enable signal generated by the time division multiplexing control circuit; and
a logic gate coupled to an output node of the at least one register circuit, wherein the logic gate is configured to generate an address uniqueness test output.

20. The testing device of claim 19, wherein the amplifier circuit comprises a current-to-voltage converter circuit.

* * * * *